US006879519B1

(12) United States Patent
Yip

(10) Patent No.: US 6,879,519 B1
(45) Date of Patent: Apr. 12, 2005

(54) NON-VOLATILE PROGRAMMABLE FUSE APPARATUS IN A MEMORY DEVICE

(75) Inventor: Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/903,395

(22) Filed: Jul. 30, 2004

(51) Int. Cl.[7] .............................................. G11C 16/04
(52) U.S. Cl. ......................... 365/185.07; 365/185.17; 365/185.09; 365/185.33; 365/185.13
(58) Field of Search ....................... 365/185.17, 185.09, 365/185.05, 185.07, 185.33, 185.13, 185.11

(56) References Cited

U.S. PATENT DOCUMENTS

| 5,031,011 A | * | 7/1991 | Aritome et al. .............. 257/319 |
| 5,172,198 A | * | 12/1992 | Aritome et al. ......... 365/185.17 |
| 5,200,652 A | | 4/1993 | Lee ............................... 326/47 |
| 5,412,593 A | | 5/1995 | Magel et al. .................. 365/96 |
| 5,428,304 A | | 6/1995 | Landers et al. ................ 326/41 |
| 5,789,796 A | | 8/1998 | Kang et al. ................... 257/530 |
| 6,330,189 B1 | * | 12/2001 | Sakui et al. ........... 365/185.22 |
| 6,567,315 B2 | * | 5/2003 | Takase et al. .......... 365/185.28 |
| 6,590,797 B1 | | 7/2003 | Nachumovsky et al. ....... 365/96 |
| 6,744,682 B2 | | 6/2004 | Morgan ....................... 365/201 |
| 6,770,925 B2 | * | 8/2004 | Hung et al. .................. 257/296 |
| 2003/0036226 A1 | | 2/2003 | Morgan ....................... 438/200 |
| 2003/0223291 A1 | | 12/2003 | Nachumovsky et al. .... 365/200 |
| 2004/0084718 A1 | * | 5/2004 | Hung et al. .................. 257/317 |

* cited by examiner

Primary Examiner—Andrew Q. Tran
(74) Attorney, Agent, or Firm—Leffert Jay & Polglaze, P.A.

(57) ABSTRACT

The non-volatile, programmable fuse apparatus has a pair of p-channel transistors coupled in a latch configuration. A supercell is coupled between each transistor and ground. Each supercell is comprised of a plurality of non-volatile memory cells that are each programmed substantially similarly for each supercell. The supercells are programmed in a complementary fashion. The output state of the apparatus is determined by the state of the supercell to which the output is coupled.

24 Claims, 4 Drawing Sheets

NON-VOLATILE PROGRAMMABLE FUSE APPARATUS IN A MEMORY DEVICE

TECHNICAL FIELD OF THE INVENTION

The present invention relates generally to memory devices and in particular the present invention relates to programmable fuses in a memory device.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Flash memory devices typically use fuse elements for storing control, trimming, and/or operational status data. For example, lock bits might be stored in a mini-array of fuse elements to indicate when a block of flash memory is write protected.

Typically, fuses in non-volatile memory designs employ a single core cell as the fusible element. This fusible element has substantially the same reliability as the main memory array.

As with other memory devices, defects can occur during the manufacture of a flash memory array having rows and columns of memory cells. Typical defects can include bad memory cells, open circuits, charge loss or gain, shorting between bitlines (columns), and shorting between wordlines (rows). Short conditions typically occur because of the large number of rows and columns of memory cells that have to be placed in close proximity to each other on an integrated circuit. Defects can reduce the yield of the flash memory device. In fact, some short conditions may cause the device to be useless.

For the reasons stated above, and for other reasons stated below which will become apparent to those skilled in the art upon reading and understanding the present specification, there is a need in the art for reducing or eliminating the problems associated with a short or other defect in a memory device.

SUMMARY

The above-mentioned problems with short conditions in a memory device and other problems are addressed by the present invention and will be understood by reading and studying the following specification.

The present invention encompasses a non-volatile programmable fuse apparatus in a memory device. The apparatus is comprised of a pair of transistors coupled in a latch configuration. Each transistor has a drain, a source, and a gate connection. The gate connection of a first transistor is coupled to the source of the second transistor and the gate connection of the second transistor is coupled to the source of the first transistor. The drain connections of the pair of transistors are coupled to a supply voltage.

The apparatus further has a pair of programmable, non-volatile fuse elements. Each fuse element is coupled to a different transistor and each fuse element comprises a plurality of non-volatile memory cells.

Each of the plurality of non-volatile memory cells has a control gate, a drain connection, and a source connection. In one embodiment, the plurality of non-volatile memory cells are arranged in a matrix configuration such that a wordline of a plurality of wordlines couples the control gates of the memory cells in each row of the matrix. The columns of the matrix are formed by series connections of source connection to drain connection of a subset of memory cells of the plurality of non-volatile memory cells.

A common wordline connection is coupled to the plurality of wordlines. A common drain connection is coupled to a top of each column of the matrix. A common source connection is coupled to the bottom of each column of the matrix.

Further embodiments of the invention include methods and apparatus of varying scope.

DETAILED DESCRIPTION

Figure 2:
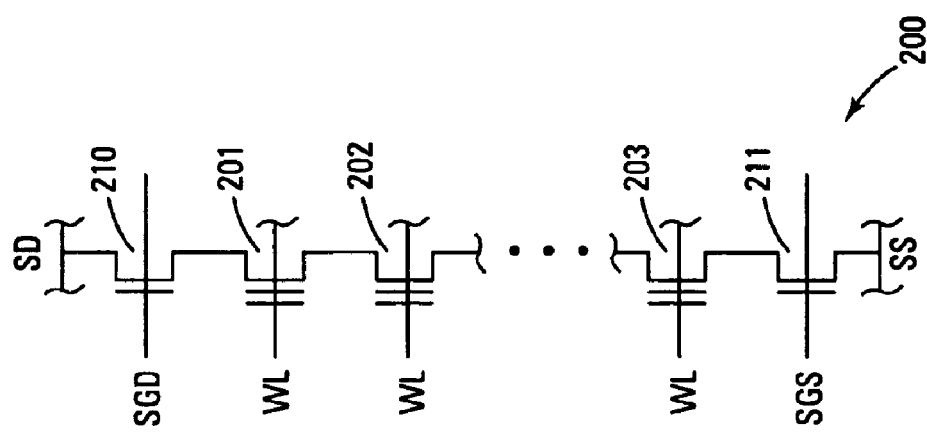
FIG. 2 shows a schematic diagram of one embodiment of a string of cells in accordance with the embodiment of FIG. 1.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
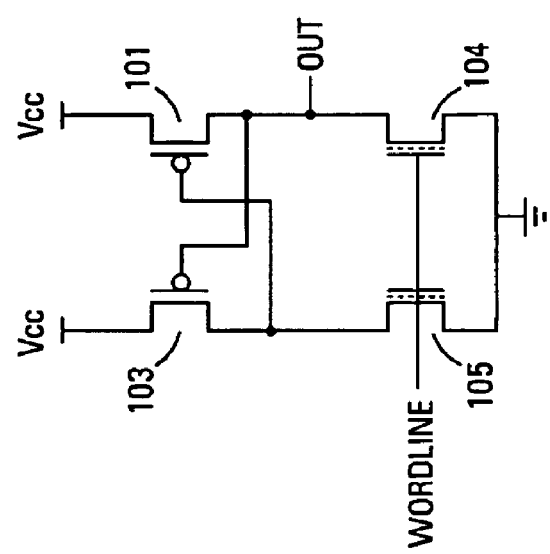
FIG. 1 shows a schematic diagram of one embodiment of the non-volatile programmable fuse apparatus of the present invention.

FIG. 1 illustrates a schematic diagram of one embodiment of the non-volatile programmable fuse apparatus of the present invention. The apparatus is comprised of two p-channel transistors 101 and 103 and two supercells 104 and 105. These elements are configured as a latch with an output OUT. A supercell 104 or 105 is a programmable, non-volatile fuse element that is comprised of a plurality of non-volatile memory cells and is discussed subsequently in greater detail with reference to FIGS. 2, 3, and 4.

The drains of the two p-channel transistors 101 and 103 are coupled to $V_{CC}$. In one embodiment, VCC is approximately +5V. However, this predetermined voltage will be different for different memory device technologies.

The sources of the transistors 101 and 103 are coupled to the drains of their respective supercell 104 and 105. The p-channel's control gates are coupled to the opposing transistor's 103 or 101 source. These transistors provide a self-biasing function to the apparatus. Alternate embodiments may use other types of transistors than p-channel transistors.

The supercells 104 and 105 of the present invention are programmed in a complimentary fashion (i.e., one supercell 104 or 105 is erased while the other 105 or 104 is programmed). The output of the latch, OUT, will be in either a logical high state or a logical low state depending on how the supercells 104 and 105 are programmed. If the supercell whose drain is coupled to the OUT signal is programmed, the OUT signal will be a logical 0. If this supercell 104 is erased, the OUT signal will be a logical 1.

The supercells 104 and 105 of FIG. 1 are comprised of a quantity of NAND strings of non-volatile memory cells connected in parallel. FIG. 2 illustrates one example of such a NAND memory cell string.

The string 200 of FIG. 2 is comprised of a predetermined quantity of core floating gate, non-volatile memory cells 201–203 that are connected in series, source to drain. A wordline is coupled to the control gate of each core memory cell. The entire string 200 has a string drain (SD) and a string source (SS) that are connected to other memory cell strings as described subsequently with reference to FIG. 3.

Enable transistors 210 and 211 are located on either end of the string 200. One transistor 210 is coupled to the drain end of each string and the other transistor 211 is coupled to the source end of each string. The drain enable transistor 210 is enabled by a control signal, SGD, coupled to its control gate. The source enable transistor 211 is enabled by a control signal, SGS, coupled to its control gate.

The core memory cell string 200 of the present invention acts as an electrically fusible element. In one embodiment, the series string 200 is comprised of eight core, non-volatile memory cells. Alternate embodiments use other quantities of core non-volatile memory cells.

One embodiment of the present invention uses floating gate, flash memory cells as the core memory cells. The present invention, however, is not limited to any one type of non-volatile memory cell. Additional embodiments could include laser fuses or anti-fuses.

In the above-described embodiment, the core cells are coupled in a NAND configuration. However, alternate embodiments may couple the core cells in other configurations. For example, one embodiment may couple them in a NOR configuration by stringing individual NOR cells in series and configuring several strings in parallel in order to imitate a NAND structure.

Operation of the core non-volatile, floating gate memory cells is well known in the art. If a core cell were in a programmed state, the excess electrons present on the floating gate increase the threshold voltage. Thus, if the control gate to source voltage is less than the threshold voltage, it would not be sufficient to turn on the memory cell. In other words, current would not be conducted through the channel region. The resultant lack of cell current would indicate that the memory cell was in a programmed state. If the memory cell were in an erased state, the threshold voltage of the cell increases. In that case, the cell would conduct current in response to the control gate voltage. This would be sensed to indicate that the cell was in the erased state. More detailed floating gate operations, including sensing, writing and erasing, are known to those skilled in the art and are not discussed further.

Figure 3:
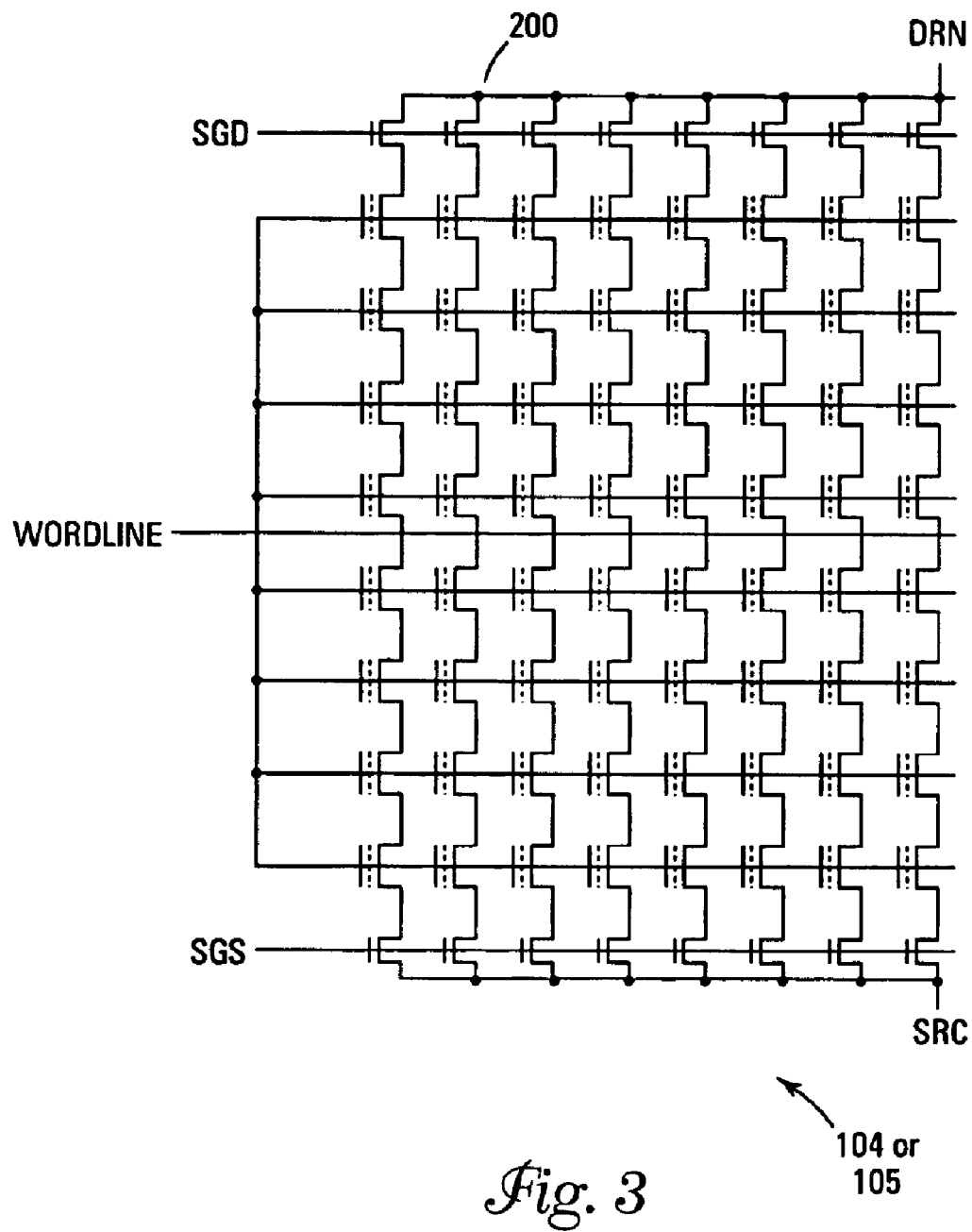
FIG. 3 shows a schematic diagram of one embodiment of a supercell in accordance with the embodiments of FIGS. 1 and 2.

FIG. 3 illustrates a supercell memory element 104 or 105 of the present invention. The embodiment of FIG. 3 comprises eight parallel strings 200 of non-volatile memory cells in accordance with the embodiment of FIG. 2. Each parallel string is a column or bitline of the supercell memory element. The embodiments of the present invention are not limited to any one matrix configuration of core memory cells. Alternate embodiments may use other quantities of memory cell strings 200.

The memory cell strings are coupled in parallel such that the top drain connections of the memory cell strings are coupled together in a common drain connection, DRN. Similarly, the bottom source connections of the memory cell strings are coupled together in a common source connection, SRC. The parallel wordlines are coupled together into a common wordline for the supercell.

The signal (SGD) to enable the drain enable transistors is common to all of the strings. Similarly, the signal (SGS) to enable the source enable transistors is common to all of the strings. The SGD and SGS signals for enabling the strings are well known in the art and are not discussed further.

A supercell that is programmed will have all of its constituent core cells in a programmed state. Similarly, a supercell that is erased will have all of its constituent core cells in an erased state.

Figure 4:
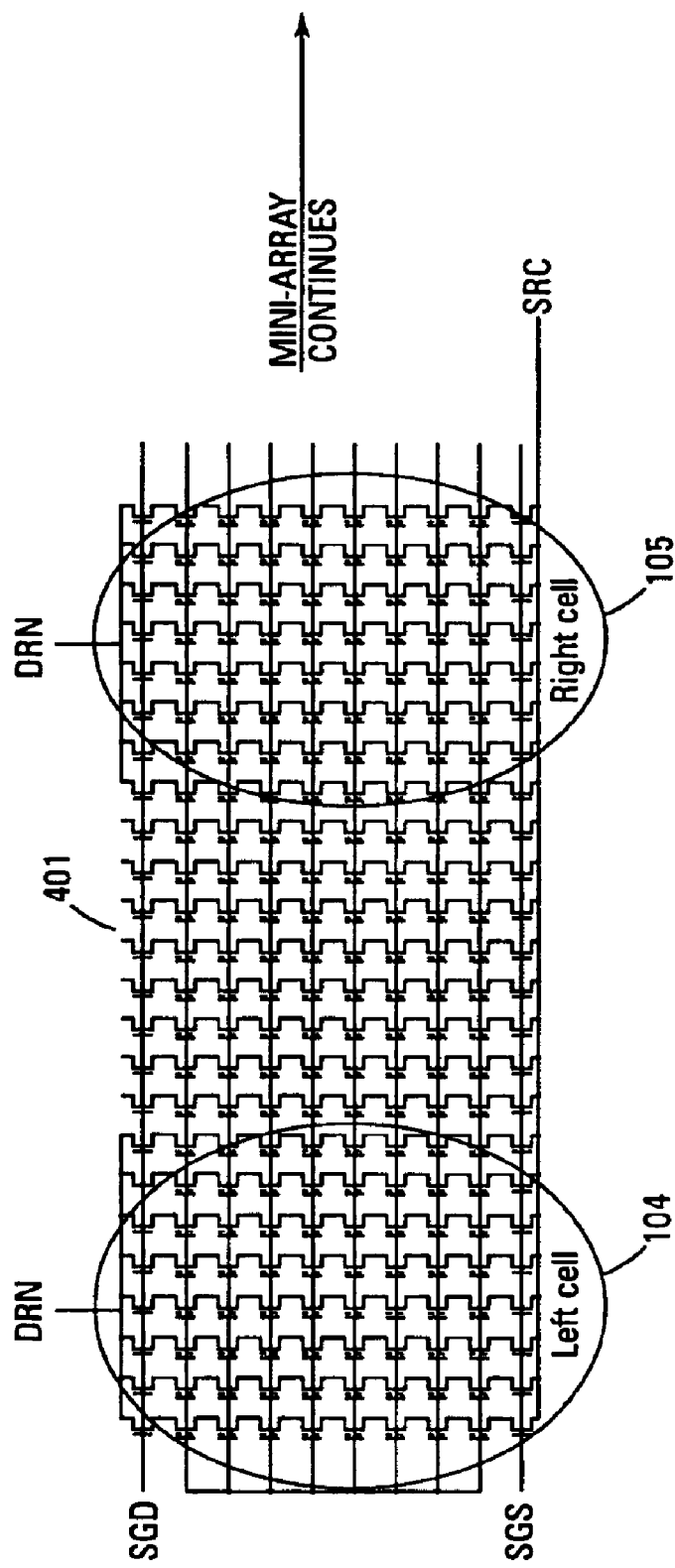
FIG. 4 shows a schematic diagram of one embodiment of two supercells of the present invention incorporated into a mini-array.

FIG. 4 illustrates one implementation of the supercell embodiment of FIG. 3. This embodiment incorporates the two supercells 104 and 105 of the non-volatile, programmable fuse apparatus into a mini-array of a memory device. The mini-array further comprises a plurality of unused dummy cells 401 that can be used for further expansion in future designs.

Only a small portion of the mini-array is illustrated in FIG. 4. The mini-array continues to the right and/or left and may comprise additional supercells or cells used for other purposes.

In operation, power is applied to the programmable, non-volatile fuse apparatus of the present invention. The supercells are then programmed in a complementary fashion.

The programming of the supercells is accomplished in substantially the same manner as the programming of a single core memory cell. Since the source, drain, and control gate connections of the core memory cells are coupled such that the matrix of memory cells of the supercell act as one memory cell, the same control signals and voltages are applied to the supercell for programming as would be applied to a core memory cell.

Which of the two supercells is programmed and which is erased is determined by the desired state of the output of the fuse apparatus. As described above in FIG. 1, if it is desired that the output of the fuse apparatus be a logical high, the supercell 104 coupled to the OUT signal would be erased and the remaining supercell 105 would be programmed. If the OUT signal is desired to be a logical low, the supercell 104 coupled to the OUT signal would be programmed and the remaining supercell 105 would be erased.

Once programmed, the supercells are fusible elements that are immune to charge gain or loss. For an erased supercell, should a core cell gain charge and stop conducting, the string it resides in will stop conducting. However, the remaining strings of the supercell will continue to conduct. This renders the erased supercell unaffected by one or more defective core cells.

If the supercell is programmed and one or more core cells lose charge and start to conduct, the remaining cells in the string will cut off the conduction. This again renders the programmed supercell unaffected by one or more defective core cells.

Since each supercell is comprised of multiple strings in parallel, if a drain contact is missing, thus rendering the string to be non-conductive, the other strings of the supercell in parallel will take up the slack. Bitline-to-bitline shorts also have no effect on circuit performance since the strings are in parallel. Similarly, wordline-to-wordline shorts have no effect on circuit performance since the wordlines operate in parallel.

Figure 5:
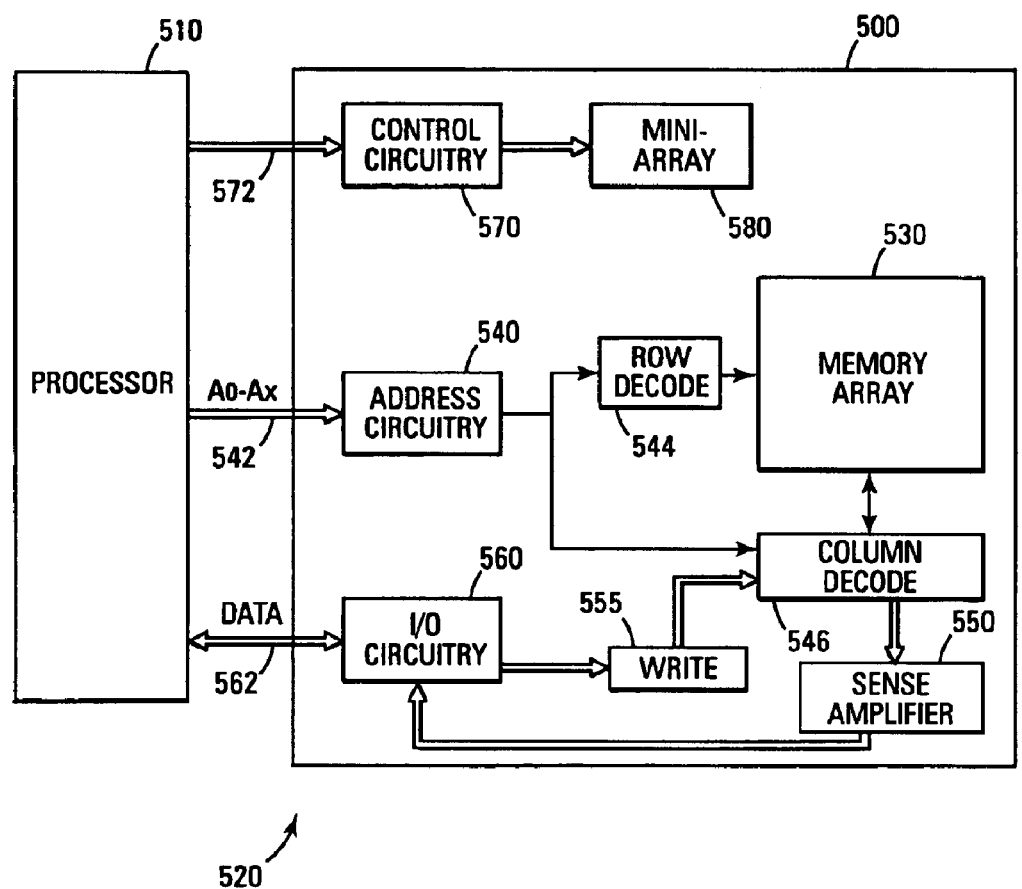
FIG. 5 shows a block diagram of an electronic system of the present invention.

FIG. 5 illustrates a functional block diagram of a memory device 500 that can incorporate the flash memory cells of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of flash memory cells 530 that can be floating gate flash memory cells. The memory array 530 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller.

The control circuitry 570 can also program the mini-array 580 in which the non-volatile, programmable fuse apparatus of the present invention can reside, in one embodiment. The mini-array 580 may be responsible for holding trimming data, memory block lock data, record keeping data for the memory device, and other data required for operation of the memory device.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the embodiments of the non-volatile programmable fuse apparatus of the present invention provide a fusible element that is immune to defective memory cells, short conditions, and other defects that would normally ruin an entire memory device. By creating a supercell that is comprised of a matrix of core non-volatile memory cells; each similarly programmed, the supercell can be used in place of a single fusible element.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A programmable, non-volatile fuse element comprising:
    a plurality of non-volatile memory cells each comprising a control gate, a drain connection, and a source connection, the plurality of non-volatile memory cells arranged in a matrix such that a wordline of a plurality of wordlines couples the control gates of the memory cells in each row of the matrix and columns of the matrix are formed by series connections of source to drain of a subset of memory cells of the plurality of non-volatile memory cells;
    a common wordline connection coupled to the plurality of wordlines;
    a common drain connection coupled to a top of each column of the matrix; and
    a common source connection coupled to a bottom of each column of the matrix.

2. The fuse element of claim 1 wherein the plurality of wordlines are substantially parallel to each other.

3. The fuse element of claim 1 wherein the subset of memory cells is comprised of eight memory cells.

4. The fuse element of claim 1 wherein the matrix comprises an eight by eight non-volatile memory cell configuration.

5. The fuse element of claim 1 and further including a first enable transistor coupled to the top of each column and a second enable transistor coupled to the bottom of each column.

6. A programmable, non-volatile fuse element comprising:
    a plurality of memory cell strings arranged in parallel, each string comprising:
        a plurality of core, non-volatile memory cells, each core memory cell comprising a control gate, a drain connection, and a source connection, the plurality of core memory cells coupled in a series fashion such that the source connection of a previous core memory cell is coupled to the drain of a subsequent core memory cell, each string having a drain end and a source end;
    a plurality of wordlines, each wordline coupling the control gates of the memory cells in a row of memory cells formed from the plurality of parallel memory cell strings;
    a common wordline connection coupled to the plurality of wordlines;
    a common drain connection coupled the drain ends of each memory cell string; and a common source connection coupled to the source ends of each memory cell string.

7. The fuse element of claim 6 wherein the core, non-volatile memory cell is a flash memory cell.

8. The fuse element of claim 6 wherein the plurality of memory cell strings comprises eight strings and the plurality of core, non-volatile memory cells comprises eight core memory cells.

9. The fuse element of claim 6 wherein each of the plurality of memory cell strings further comprises a drain enable transistor at the drain end of each memory cell string and a source enable transistor at the source end of each memory cell string.

10. A non-volatile programmable fuse apparatus in a memory device, the apparatus comprising:
   a plurality of transistors each having a drain, a source, and a gate connection, the gate connection of a first transistor coupled to the source of a second transistor and the gate connection of the second transistor coupled to the source of the first transistor, the drain connections of the plurality of transistors coupled to a predetermined voltage; and
   a plurality of programmable, non-volatile fuse elements, each fuse element coupled to a different transistor and each fuse element comprising a plurality of non-volatile memory cells.

11. The apparatus of claim 10 wherein each programmable, non-volatile fuse element comprises:
   a plurality of non-volatile memory cells each comprising a control gate, a drain connection, and a source connection, the plurality of non-volatile memory cells arranged in a matrix such that a wordline of a plurality of wordlines couples the control gates of the memory cells in each row of the matrix and columns of the matrix are formed by series connections of source to drain of a subset of memory cells of the plurality of non-volatile memory cells;
   a common wordline connection coupled to the plurality of wordlines;
   a common drain connection coupled to a top of each column of the matrix; and
   a common source connection coupled to a bottom of each column of the matrix.

12. The apparatus of claim 10 wherein the plurality of transistors are p-channel transistors.

13. The apparatus of claim 10 wherein the plurality of programmable, non-volatile fuse elements comprise two fuse elements that are programmed in a complementary fashion.

14. The apparatus of claim 10 wherein the plurality of programmable, non-volatile fuse elements are floating gate memory cells and a first fuse element of the plurality of programmable, non-volatile fuse elements is in a programmed state and a second fuse element is in an erased state.

15. A non-volatile programmable fuse apparatus in a memory device, the apparatus comprising:
   a pair of p-channel transistors each having a drain, a source, and a gate connection, the gate connection of a first transistor coupled to the source of a second transistor and the gate connection of the second transistor coupled to the source of the first transistor, the drain connections of the p-channel transistors coupled to a supply voltage;
   a pair of programmable, non-volatile fuse elements each coupled to the source of a transistor, each fuse element comprising a plurality of non-volatile memory cells and the pair of fuse elements are programmed in a complementary fashion; and
   an output connection coupled between a transistor of the pair of p-channel transistors and a fuse element of the pair of programmable, non-volatile fuse elements.

16. The apparatus of claim 15 wherein the pair of programmable, non-volatile fuse elements are each comprised of a plurality of floating gate flash memory cells and the plurality of floating gate flash memory cells of a first fuse element are substantially all erased and the plurality of floating gate flash memory cells of the remaining fuse element are substantially all programmed.

17. The apparatus of claim 16 wherein a state of the output of the apparatus is determined in response to which of the pair of programmable, non-volatile fuse elements is erased and which is programmed.

18. The apparatus of claim 16 wherein the plurality of non-volatile memory cells comprising each programmable, non-volatile fuse element are arranged in an eight columns-by-eight rows orientation such that the columns comprise a source to drain series bitline connection of the memory cells and the rows comprise a wordline coupling control gates of each memory cell in the row, the bitlines of each column coupled in a common drain connection on one end of the column and a common source connection on the other end of the column.

19. The apparatus of claim 18 and further including an enable transistor on each end of each column.

20. An electronic system comprising:
   a processor that generates control signals for the system; and
   a non-volatile, programmable latch coupled to the processor, the latch comprising:
      a pair of transistors each having a drain, a source, and a gate connection, the gate connection of a first transistor coupled to the source of a second transistor and the gate connection of the second transistor coupled to the source of the first transistor, the drain connections of the pair of transistors coupled to a supply voltage;
      a pair of programmable, non-volatile fuse elements, each fuse element coupled to a different transistor of the pair of transistors and each fuse element comprising a plurality of non-volatile memory cells; and
      an output connection coupled between a first fuse element and the first transistor.

21. The system of claim 20 wherein the pair of transistors are p-channel transistors and the plurality of non-volatile memory cells are floating gate flash memory cells.

22. A method for programming a non-volatile fuse apparatus comprising a pair of transistors coupled in a latch configuration and a pair of programmable, non-volatile fuse elements, the method comprising:
   biasing the apparatus;
   programming, to a first state, a first fuse element of the pair of fuse elements that are each comprised of a plurality of non-volatile memory cells, each memory cell programmed to a substantially similar state; and
   programming, to a complementary state of the first state, a second fuse element such that each of the plurality of non-volatile memory cells is programmed to a substantially similar state.

23. The method of claim 22 wherein the plurality of non-volatile memory cells of the first fuse element are programmed and the plurality of non-volatile memory cells of the second fuse element are erased.

24. The method of claim 22 wherein an output of the apparatus is in response to one of the first state or the complementary state.

* * * * *